United States Patent
Haacke et al.

(10) Patent No.: US 7,782,051 B2
(45) Date of Patent: Aug. 24, 2010

(54) GEOMETRY BASED FIELD PREDICTION METHOD FOR SUSCEPTIBILITY MAPPING AND PHASE ARTIFACT REMOVAL

(75) Inventors: E. Mark Haacke, Grosse Pointe Farms, MI (US); Jaladhar Neelavalli, Detroit, MI (US); Yu-Chung Norman Cheng, Northville, MI (US)

(73) Assignee: MR Innovations, Inc., Detroit, MI (US)

( * ) Notice: Subject to any disclaimer, the term of this patent is extended or adjusted under 35 U.S.C. 154(b) by 81 days.

(21) Appl. No.: 12/105,917

(22) Filed: Apr. 18, 2008

(65) Prior Publication Data
US 2009/0261824 A1    Oct. 22, 2009

(51) Int. Cl.
G01V 3/00    (2006.01)
(52) U.S. Cl. .................................... 324/307
(58) Field of Classification Search .......... 324/300–322
See application file for complete search history.

(56) References Cited

U.S. PATENT DOCUMENTS

| | | | |
|---|---|---|---|
| 5,225,781 A * | 7/1993 | Glover et al. | 324/309 |
| 5,408,178 A | 4/1995 | Wikswo, Jr. et al. | |
| 6,477,398 B1 | 11/2002 | Mills | |
| 6,658,280 B1 | 12/2003 | Haacke | |
| 2005/0033154 A1* | 2/2005 | deCharms | 600/410 |
| 2008/0001600 A1* | 1/2008 | deCharms | 324/309 |
| 2009/0179642 A1* | 7/2009 | deCharms | 324/309 |

OTHER PUBLICATIONS

Du et al., "Simultaneous Acquisition of MR Angiography and Venography (MRAV)", Magnetic Resonance in Medicine, 2008, pp. 954-958, vol. 59.

* cited by examiner

*Primary Examiner*—Brij B Shrivastav
*Assistant Examiner*—Dixomara Vargas
(74) *Attorney, Agent, or Firm*—Thompson Coburn LLP; Clyde L. Smith, Esq.

(57) ABSTRACT

The present invention provides a method of handling rapid phase aliasing in magnetic resonance images arising from local magnetic susceptibility differences. The methods of the present invention can be used to estimate the field effects within an object arising from the interfaces of regions having differences in magnetic susceptibilities, and to subtract out the resulting phase from the original or source phase data prior to any further phase processing. The methods of the present invention also include a process of accurately determining the susceptibility values of multiple voxel regions based on the geometry of such regions.

19 Claims, 1 Drawing Sheet

GEOMETRY BASED FIELD PREDICTION METHOD FOR SUSCEPTIBILITY MAPPING AND PHASE ARTIFACT REMOVAL

CROSS-REFERENCE TO RELATED APPLICATIONS

None.

STATEMENT REGARDING FEDERALLY SPONSORED RESEARCH OR DEVELOPMENT

Not Applicable.

APPENDIX

Not Applicable.

BACKGROUND OF THE INVENTION

1. Field of the Invention

This invention relates generally to magnetic resonance imaging. More particularly, the present invention pertains to methods of using the geometry of scanned objects to estimate local fields and to refine magnetic resonance images thereof.

2. Related Art

Susceptibility weighted imaging (SWI) has become a powerful clinical tool for revealing the presence of microhemorrhages, iron and calcium and, therefore, for studying aging and diseases such as, multiple sclerosis, stroke, trauma and tumors. However, prior art SWI techniques suffer from problems caused by rapid phase aliasing resulting from changes in the background magnetic field caused by the presence of air/tissue interfaces, particularly in the mid-brain and the forebrain regions. Although the presence of low spatial frequency fields can be reasonably dealt with using various high pass filter approaches, problems still exist due to rapid unwanted field variations particularly near the mastoid, frontal, ethmoid and sphenoid sinuses and to a lesser degree the maxillary sinuses. There have been some attempts to remove these problems by phase unwrapping the images and then either high pass filtering the data or doing a polynomial fit to remove the background fields. The goal in all of these phase machinations is to leave behind, preferably unaltered, the local phase information (arising from local susceptibility differences) from structures such as the veins, iron laden tissue and calcifications. However, each of these prior art methods has drawbacks. While simple high pass filtering is able to remove low spatial frequency phase variations, very strong high pass filter is usually needed to remove the rapid phase aliasing near the air/tissue interface, which results in a concomitant loss of important local phase information. On the other hand, removal of aliasing by a fitting approach requires local polynomial fits throughout the brain on a slice by slice basis and often with different regions within a given slice fitted with different order polynomials.

SUMMARY OF THE INVENTION

The present invention provides a superior alternative for handling rapid phase aliasing arising from local magnetic susceptibility differences. The present invention can be used to estimate the field effects within the brain (or other subject matter) arising from the interfaces of regions having differences in magnetic susceptibilities (hereinafter simply susceptibility), and to subtract out the resulting phase from the original or source phase data prior to any further phase processing (i.e. unwrapping/homodyne filtering etc).

The methods of the present invention include a process of accurately determining the susceptibility values of multiple voxel regions based on the geometry of such regions. By finding such local susceptibilities, this methods of the present invention also lead to a new type of image that the inventors refer to as a susceptibility image or susceptibility map.

In one aspect of the invention, a method comprises steps of obtaining magnetic resonance phase data of an object, and assigning a phase value to each of a plurality of voxels. The phase values are dependent upon the phase data, but need not be unaltered data. The object in this case is the subject of the image, such as a brain. This method also comprises a step of dividing the plurality of voxels into at least first and second regions (representative of regions within the subject of the image). Furthermore, the method comprises steps of assigning an initial susceptibility value to each of the voxels of the first region and assigning an initial susceptibility value to each of the voxels of the second region. The initial susceptibility values of the voxels of the first region are identical to each other. The initial susceptibility values of the voxels of the second region are also identical to each other. Still further, the method comprising a step of determining which of the plurality of voxels meet a criteria. The criteria is dependent upon a signal-to-noise ratio of the phase values. The method also comprises a steps of assigning a revised susceptibility value to each of the voxels of the first region, and assigning a revised susceptibility value to each of the voxels of the second region. The revised susceptibility values of the voxels of the first region are identical to each other and are dependent upon the phase data associated with only the voxels that meet the criteria. The revised susceptibility values of the voxels of the second region are identical to each other, different from the susceptibility values of the voxels of the first region, and dependent upon the phase data associated with only the voxels that meet the criteria. Still further, the method comprises a step of generating an image that is dependent upon the revised susceptibility values.

In another aspect of the invention, a method comprises steps of obtaining magnetic resonance phase data of an object and assigning a first phase value to each of a plurality of voxels. The first phase values is dependent upon the phase data. The method also comprises steps of dividing the plurality of voxels into at least first and second regions and assigning each of the voxels in the first region a susceptibility value. Furthermore, the method comprises a step of estimating an induced phase value for each of the voxels of the second region. The induced phase values are dependent upon the susceptibility values of the voxels of the first region. Still further, the method comprises a step of generating revised phase values for each of the voxels of the second region. The revised phase values are dependent upon the first phase values and the induced phase values. Moreover, the method comprises a step of generating an image that is dependent upon the revised phase values.

Further features and advantages of the present invention, as well as the operation of the preferred embodiments of the present invention, are described in detail below with reference to the accompanying figure.

DETAILED DESCRIPTION OF THE PREFERRED EMBODIMENTS

Estimating Magnetic Susceptibility Based on Geometry

Figure 1:
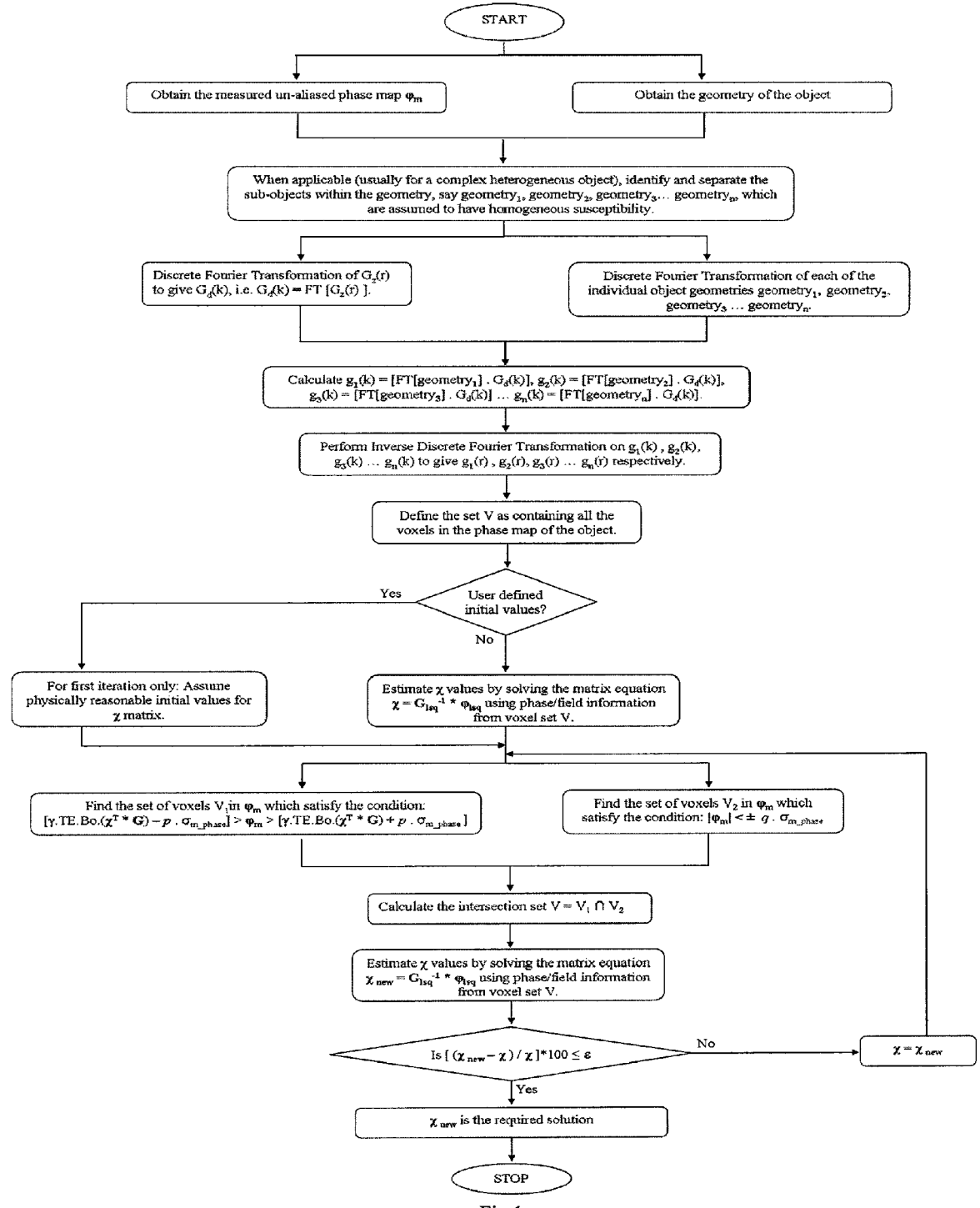
FIG. 1 illustrates a flow chart of a preferred iterative process of estimating susceptibility values.

A preferred embodiment of the invention makes use of an iterative process of obtaining susceptibilities of various regions with an object using a discrete estimation technique that makes use of only those voxels having high signal-to-noise phase data. The voxel signals corresponding to an image can be divided into regions based on a presumption that that the regions have dissimilar overall susceptibilities. This division can be performed using human perception, computational analysis, or some combination thereof. Each iteration refines estimated susceptibility values correlating to the various regions of voxels.

Some background theory is presented herein for purposes of describing the iterative methods of present invention, starting with equations pertaining to the three-dimensional induced field distribution and its Greens Function. The three-dimensional induced magnetic field due to magnetization distribution, $\vec{M}(\vec{r})$, is given by $$\vec{B}(\vec{r}) = \frac{\mu_0}{4\pi} \int_V d^3 r' \left\{ \frac{3\vec{M}(\vec{r}')\cdot(\vec{r}-\vec{r}')}{|\vec{r}-\vec{r}'|^5}(\vec{r}-\vec{r}') - \frac{\vec{M}(\vec{r}')}{|\vec{r}-\vec{r}'|^3} \right\} \quad (1)$$

This equation indicates that the induced field distribution can be expressed as a convolution between the magnetization distribution and the Greens function. Eq. (1) may be easily calculated in the Fourier domain (k-space domain) and then Fourier transformed back to the spatial domain. In addition, the Lorentz sphere correction has been included in Eq. (1).

If the main field is along the z-axis, then only the z-component of the magnetic field is important in most MRI research. The z-component of the induced magnetic field $B_z(\vec{r})$ and its Fourier pair in k-space are $$B_z(\vec{r}) = \frac{\mu_0}{4\pi} \int_V d^3 r' \left\{ \frac{3M_z(\vec{r}')(z-z')^2}{|\vec{r}-\vec{r}'|^5} - \frac{M_z(\vec{r}')}{|\vec{r}-\vec{r}'|^3} \right\} \quad (2)$$

$$\equiv \mu_0 \int_V d^3 r' M_z(\vec{r}') G_{z,3D}(\vec{r}-\vec{r}')$$

$$B_z(\vec{k}) \equiv \mathcal{F}\{B_z(\vec{r})\} \quad (3)$$

$$= \mu_0 M_z(\vec{k}) G_{c,3D}(\vec{k})$$

where $M_z(\vec{k})$ is the Fourier transformation of $M_z(\vec{r})$ and the Greens function $G_{z,3D}(\vec{r})$ is defined as $$G_{z,3D}(\vec{r}) \equiv \frac{1}{4\pi} \cdot \frac{3z^2 - r^2}{r^5} \quad (4)$$

$$\equiv \frac{1}{4\pi} \cdot \frac{3\cos^2\theta_{3D} - 1}{r^3}$$

where $\theta_{3D}$ is the azimuthal angle in the spherical coordinate system and $r^2 \equiv x^2+y^2+z^2$. The Fourier transformation of $G_{z,3D}(\vec{r})$ is $$G_{c,3D}(\vec{k}) \equiv \mathcal{F}\{G_{z,3D}(\vec{r})\} = \frac{1}{3} - \frac{k_z^2}{k^2} \quad (5)$$

where $k^2 \equiv k_x^2 + k_y^2 + k_z^2$ and the notation $G_{c,3D}$ denotes the continuous Fourier transformation of the three-dimensional Greens function. Equation (5) is valid when k is not equal to zero or infinity. When k=0, the derivation of $G_{c,3D}(\vec{k})$ indicates that $G_{c,3D}(0)=0$ as long as the integral is calculated over the entire space larger than a small sphere with radius $\epsilon$. Because the Lorentz sphere correction has been included in Eq. (1), it is consistent to assign zero to $G_{c,3D}(0)$ for future numerical calculations.

The induced magnetic field of an infinitely long object can be calculated from a two-dimensional Greens function. Similar to the electric field distribution due to an electric dipole, the magnetic field ($\vec{H}$) in a two-dimensional plane due to the scalar potential of dipole $\vec{m}$ may be written as $$\vec{H}(\vec{x}) = -\frac{1}{2\pi} \vec{\nabla}\left(\frac{\vec{m}\cdot\vec{x}}{\rho^2}\right) = \frac{1}{2\pi}\left(\frac{2\vec{x}(\vec{m}\cdot\vec{x})}{\rho^4} - \frac{\vec{m}}{\rho^2}\right) \quad (6)$$

Given that the $\vec{B}$ field is equal to $\mu_0(\vec{H}+\vec{M})$, after replacing the magnetic dipole moment by a magnetization distribution, the induced magnetic field in the two-dimensional plane becomes $$\vec{B}(\vec{x}) = \frac{\mu_0}{2\pi} \int d^2 x' \left\{ \frac{2\vec{M}(\vec{x}')\cdot(\vec{x}-\vec{x}')}{|\vec{x}-\vec{x}'|^4}(\vec{x}-\vec{x}') - \frac{\vec{M}(\vec{x}')}{|\vec{x}-\vec{x}'|^2} \right\} + \mu_0 \vec{M}(\vec{x}) \quad (7)$$

At this point $\vec{M}(\vec{x})$ in the second term could be replaced by $\int d^2 x' \vec{M}(\vec{x}')\delta^{(2)}(\vec{x}-\vec{x}')$. However, Eqs. (6) and (7) do not properly evaluate the field at the origin, where the magnetic dipole moment is located. Applying the Lorentz disk corrections, the corrected magnetic field embedded in the three-dimensional space is approximated by $$\vec{B}(\vec{x}) \simeq \frac{\mu_0}{2\pi} \int d^2 x' \left\{ \frac{2\vec{M}(\vec{x}')\cdot(\vec{x}-\vec{x}')}{|\vec{x}-\vec{x}'|^4}(\vec{x}-\vec{x}') - \frac{\vec{M}(\vec{x}')}{|\vec{x}-\vec{x}'|^2} \right\} + \quad (8)$$

$$\left(1 - \frac{1}{2}\sin^2\theta\right)\mu_0 \vec{M}(\vec{x})$$

where $\theta$ is the angle between the main field direction and the axis of the infinitely long object. Furthermore, because the magnetic field is measured in three-dimensional space, the Lorentz sphere correction needs to be included in Eq. (8). The magnetic field then becomes $$\vec{B}(\vec{x}) \simeq \frac{\mu_0}{2\pi} \int d^2 x' \left\{ \frac{2\vec{M}(\vec{x}')\cdot(\vec{x}-\vec{x}')}{|\vec{x}-\vec{x}'|^4}(\vec{x}-\vec{x}') - \frac{\vec{M}(\vec{x}')}{|\vec{x}-\vec{x}'|^2} \right\} + \quad (9)$$

$$\left(\frac{1}{3} - \frac{1}{2}\sin^2\theta\right)\mu_0 \vec{M}(\vec{x})$$

If the main field is along the ω-direction, only the ω-component of the induced magnetic field is significant. The ω-component is $$B_\omega(\vec{x}) = \frac{\mu_0 \sin^2\theta}{2\pi} \int d^2x \left\{ \frac{2(z-z)^2 M_\omega(\vec{x})}{|\vec{x}-\vec{x}|^4} - \frac{M_\omega(\vec{x})}{|\vec{x}-\vec{x}|^2} \right\} + \left(\frac{1}{3} - \frac{1}{2}\sin^2\theta\right)\mu_0 M_\omega(\vec{x}) \equiv \mu_0 \int d^2x M_\omega(\vec{x}) G_{\omega,2D}(\vec{x}-\vec{x}) \quad (10)$$

where $$G_{\omega,2D}(\vec{x}) \equiv \frac{\sin^2\theta}{2\pi} \cdot \frac{z^2-y^2}{(z^2+y^2)^2} + \frac{3\cos^2\theta-1}{6}\delta^{(2)}(\vec{x}) \equiv \frac{\sin^2\theta}{2\pi} \cdot \frac{2\cos^2\phi-1}{\rho^2} + \frac{3\cos^2\theta-1}{6}\delta^{(2)}(\vec{x}) \quad (11)$$

where $\rho^2 \equiv z^2+y^2$ and $\phi$ is the polar angle between z and y axes. The y-z plane is chosen to be perpendicular to the axis of the object and the plane contains the normal cross section of the object. The factor $\sin^2\phi$ is included in Eq. (10). The Fourier transformation of $G_{\omega,2D}(\vec{x})$, is $$G_{c,2D}(\vec{k}) \equiv \mathcal{F}\{G_{\omega,2D}(\vec{x})\} = \frac{\sin^2\theta}{2} \cdot \frac{k_y^2-k_z^2}{k_y^2+k_z^2} + \frac{1}{6}(3\cos^2\theta-1) \quad (12)$$

$$= \frac{1}{3} - \sin^2\theta \frac{k_z^2}{k_y^2+k_z^2}$$

Similar to the three-dimensional case, Eq. (12) is valid only when $k_y^2+k_z^2$ is not equal to zero or infinity. Furthermore, when the infinitely long object is parallel to the x or z direction in the three-dimensional space with the main field parallel to the z-direction, Eq. (12) is equal to Eq. (5) with $k_x=0$ or $k_z=0$, respectively.

Although the main field has been considered as parallel to the z-direction for the three-dimensional case and ω-direction for the two-dimensional case, it should be appreciated that, for measured magnetic fields from magnetic resonance images, consideration of the field direction is not important and can be dealt with by a simple exchange or permutation of coordinates.

The continuous Greens function is derived based on an infinite field of view. However, all MR images are in a discrete form. In order to obtain consistent results shown in images, both discrete magnetization and discrete Greens function should be used in the k-space. The discrete Greens functions in the three-dimensional and two-dimensional cases can be numerically calculated from the Fourier transformation of the spatial Greens functions in Eqs. (4) and (11), respectively. Nonetheless, the values at the origin of the Greens functions warrant some discussions. In the three-dimensional case, because the Lorentz sphere correction is included in Eq. (4), $G_{z,3D}=0$ at $\vec{r}=0$. In the two-dimensional case, the three-dimensional Lorentz sphere is corrected with the presence of the two-dimensional Lorentz disk. Therefore, at $\vec{x}=0$, $G_{\omega,2D}=(3\cos^2\theta-1)/6$.

Turning now to field calculations as a forward problem, the magnetization of a non-ferromagnetic object can be expressed in terms of its magnetic susceptibility and main field $B_0$ $$\mu_0 \vec{M}(\vec{r}) = \chi(\vec{r})\vec{B}(\vec{r}) = \chi(\vec{r})\vec{B}_0 \quad (13)$$

If an object has constant susceptibility χ, then the Fourier transformation of its magnetization along the main field direction, $M_z(\vec{k})$, is simply the Fourier transformation of the geometry of the object multiplied with $\chi B_0/\mu_0$. As shown in Eq. (3), $\mu_0 M_z(\vec{k})$ should be multiplied with the Greens function in the k-space and the total result should be inverse Fourier transformed back to the spatial domain. The induced magnetic field along the main field direction is $$B_z(\vec{r}) = \mathcal{F}^{-1}\{\mathcal{F}\{\chi(\vec{r})\} \cdot G(\vec{k})\}B_0 \quad (14)$$

where $G(\vec{k})$ represents either three-dimensional or two-dimensional discrete Greens functions or continuous Greens functions. The three-dimensional and two-dimensional Greens functions and $M_z(\vec{r})$ is evaluated at integer coordinates, i.e., $\Delta x=\Delta y=\Delta z=1$ unit. Although one can evaluate these functions at a different spacing between grid points, any choice of spacing should be consistent between the evaluations of Greens functions and the geometry of the object (i.e., $M_z(\vec{r})$).

When the induced field distribution of an infinitely long object is calculated from the two-dimensional Greens function, the geometry of the object should be taken as the cross section perpendicular to the object axis. The induced field should be calculated based on the coordinate systems of the plane whose normal vector is parallel to the object axis. For example, if an infinitely long cylinder intersects at an angle θ with the main field direction, regardless the value of θ, the geometry used in calculations should be disk rather than an ellipse. If desired, this angle with respect to the field direction can be incorporated in Eq. (12).

Based on the foregoing principles, magnetic susceptibility can be determined with a high degree of accuracy. Because the Greens functions in Eqs. (5) and (12) contain null values, it is not appropriate to find susceptibility through Eq. (3) by inverting the Greens functions. Instead, for an object with constant susceptibility χ, the following goodness-of-fit least squares function can be established based on Eq. (14):

$$f = \sum_{i=1}^{n} \left(\frac{B_i - \chi B_0 g_i}{\delta B_i}\right)^2 = \sum_{i=1}^{n} \left(\frac{\phi_i - \gamma T_E \chi B_0 g_i}{\delta \phi_i}\right)^2 = \sum_{i=1}^{n} SNR_i^2 (\phi_i - \gamma T_E \chi B_0 g_i)^2 \quad (15)$$

where n is the total number of voxels used in the fit, $B_i$ is the measured magnetic field from MR images at each voxel i, $g_i$ is the induced field per unit susceptibility and per unit main field calculated based on Eq. (14), $\delta B_i$ is the uncertainty of the measured field, $\phi_i = -\gamma T_E B_i$ is the phase value at each voxel, γ is the gyromagnetic ratio, $T_E$ is the echo time, $\delta\phi_i$ is the uncertainty in the phase, and $SNR_i$ is the signal-to-noise ratio at each voxel from the magnitude image. It should be appreciated that $g_i$ depends on the geometry of the object, field of view, and the Greens function.

By minimizing the function $f$ in Eq. (15) with respect to χ, i.e., $\partial f/\partial \chi=0$, we obtain $$\chi B_0 = \frac{\sum_{i=1}^{n} B_i g_i SNR_i^2}{\sum_{i=1}^{n} g_i^2 SNR_i^2} \quad (16)$$

The uncertainty of χ can be found through an error propagation analysis $$\delta\chi = \frac{1}{\gamma T_E B_0 \sqrt{\sum_{i=1}^{n} g_i^2 SNR_i^2}} \quad (17)$$

Equations (16) and (17) show that the uncertainty of the susceptibility measurement can be reduced when the signal to noise ratio is increased.

The phase aliasing may be removed by complex dividing two phase images acquired at two different echo times with a short time difference. However, due to rapid field change within voxel, phase aliasing usually exists at voxels with low signal to noise ratios. For this reason such voxels are preferably excluded from the analyses. Furthermore, voxels containing phase values less than the noise level or their corresponding voxels in the magnitude images containing no sufficient signal to noise ratio are removed from the fitting analyses. Alternatively, one could phase unwrap the data from a single echo and use this as input. It should be appreciated that Eqs. (16) and (17) will fail if phase aliasing is not properly unwrapped.

When acquiring images, a constant phase $\phi_0$ can exist due to central frequency adjustment by the scanner or radio frequency excitation in the pulse sequence. Therefore, even for imaging one single object, practically, Eq. (15) should be modified to $$f = \sum_{i=1}^{n} SNR_i^2 (\phi_i - \phi_0 - \gamma T_E \chi B_0 g_i)^2 \quad (18)$$

Similar to the above derivation, both values of $\chi$ and $\phi_0$ can be determined by minimizing the function through the standard least squares fit method. Their associated standard deviations (i.e., uncertainties) can be found through the error propagation method.

In view of the foregoing, it should be appreciated that the induced magnetic field deviation distribution B(r), within and around an object, can be calculated through the Fourier transformation of the geometry and the tissue susceptibility $\chi(r)$ using the equation $B(r)=B_o \cdot FT^{-1}[FT[\chi(r)] \cdot FT[G(r)]]$, where Bo is the main magnetic field, FT represents a Fourier transform, and G(r) is the Green's function. The parameter $\chi(r)$ is the spatial distribution of the susceptibility within the object. For an object with uniform susceptibility, the $\chi$ of the object can be separated from its geometry function and $FT[\chi(r)]=\chi \cdot FT[geometry]$. Thus, the susceptibility of any arbitrarily shaped object with uniform $\chi$ value can be estimated by obtaining the geometry from a fast gradient echo, high bandwidth, short echo time dataset, and using a measured field map from the phase images. This can be done by fitting the object's three-dimensional field distribution estimate, using the B(r) equation and assuming $\chi=1$, to the measured field through the least squares fit method. Applying the least squares fit method minimizes $f$ in the equation $f=\Sigma^n_{i=1} SNR_i^2 [(\phi_i-(\phi_o+\chi \cdot g_i \cdot \gamma \cdot TE \cdot B_o)]$, where, 'i' denotes the voxel under consideration, $SNR_i$ is the magnitude signal to noise ratio within the voxel, $\phi_i$ is the measured, unaliased phase, $\phi_0$ is a constant phase shift due to rf pulse and frequency adjustments created by the spectrometer, $g_i$ is the matrix $FT^{-1}[FT[geometry] \cdot FT[G(r)]$, $\chi$ is the susceptibility value to be determined, and $\gamma$ and TE denote the proton gyromagnetic ratio and echo time, respectively.

Noise in the measured field map (from phase) can influence the least squares approach considerably. As such, the iterative thresholding algorithm excludes voxels with noise and those with no considerable phase information, and thereby the estimated $\chi$ eventually converges to an accurate approximation of the value of the true physical $\chi$.

The amount of phase information, $\phi_i$, which equals $\gamma \cdot TE \cdot \Delta B$, and consequently the measurable $\Delta B$ information, is echo time dependent. The standard deviation of phase is $\sigma_{phase}=1/SNR_{magnitude}$, $SNR_{magnitude}$ is determined by the SNR in the magnitude image, and is only a measure of the expected deviation of phase values from the true physical phase value within a given voxel. Thus, thresholding in phase, to exclude noise voxels using $\sigma_{phase}$, requires the knowledge of an estimate of the expected $\phi_i$ in the voxel.

The preferred algorithm of the present invention for this iterative procedure involves the following steps: (a) obtaining the field map from unaliased phase images and defining a set V which has all the voxels in the measured phase map; (b) for first iteration only, using either a physically reasonable estimate for $\chi$ and zero for $\phi_o$ as initial values or estimating $\phi_o$ and $\chi$ by least squares fitting using the phase voxel in set V; for subsequent iterations estimating $\phi_{o,(m-1)}$ and $\chi_{(m-1)}$ by least squares fitting using phase from voxels in V; (c) finding the set of voxels, V1, which satisfy $|\phi_i|>q \sigma_{phase}$; (d) finding the set of voxels V2, which satisfy the criteria $\{(\phi_{o,(m-1)}+\gamma \cdot TE \cdot B_o \cdot \chi_{(m-1)} \cdot g_i)-p_{\sigma_{phase}}\}<\phi_i<\{(\phi_{o,(m-1)}+\gamma \cdot TE \cdot B_o \cdot \chi_{(m-1)} \cdot g_i)+p_{\sigma_{phase}}\}$, where $\chi_{(m-1)}$ and $\phi_{o,(m-1)}$ are the $\chi$ and $\phi_o$ values estimated in the previous iteration; (e) determining the set V as the intersection of the voxel sets V1 and V2 found in (c) and (d) and applying the least squares fitting to this intersection set to generate new values of $\phi_{o,m}$ and $\chi_m$ and assign these new values respectively to $\phi_{o,(m-1)}$ and $\chi_{(m-1)}$; and, (f) iterating through steps (b) through (e) until the percent change between $\chi_{m-1}$ and $\chi_m$ is less than 0.1 percent. In step (c) and (d), q and p are values that can be selected or calculated based on the noise characteristics of the collected phase image.

The preferred algorithm of the present invention for this iterative procedure involves the following steps: (a) obtaining the field map from unaliased phase images and defining a set V which has all the voxels in the measured phase map; (b) for first iteration only, using either a physically reasonable estimate for $\chi$ and zero for $\phi_o$ as initial values or estimating $\phi_o$ and $\chi$ by least squares fitting using the phase voxel in set V; for subsequent iterations estimating $\phi_{o(m-1)}$ and $\chi_{(m-1)}$ by least squares fitting using phase from voxels in V; (c) finding the set of voxels, V1, which satisfy $|\phi_i|>\pm q \sigma_{phase}$; (d) finding the set of voxels V2, which satisfy the criteria $\{(\phi_{o,(m-1)}+\gamma \cdot TE \cdot B_o \cdot \chi_{(m-1)} \cdot g_i)-p \sigma_{phase}\}>\phi_i>\{(\phi_{o,(m-1)}+\gamma \cdot TE \cdot B_o \cdot \chi_{m-1} \cdot g_i)+p \sigma_{phase}\}$, where $\chi_{(m-1)}$ and $\phi_{o,(m-1)}$ are the $\chi$ and $\phi_o$ values estimated in the previous iteration; (e) determining the set V as the intersection of the voxel sets V1 and V2 found in (c) and (d) and applying the least squares fitting to this intersection set to generate new values of $\phi_{o,m}$ and $\chi_m$ and assign these new values respectively to $\phi_{o,(m-1)}$ and $\chi_{(m-1)}$; and, (f) iterating through steps (b) through (e) until the percent change between $\chi_{m-1}$ and $\chi_m$ is less than 0.1 percent. In step (c) and (d), q and p are values that can be selected or calculated based on the noise characteristics of the collected phase image.

FIG. 1 shows a flow chart of the application of the preferred iterative process. In FIG. 1, FT is the Discrete Fourier Transformation, $G_d(k)=FT[G_z(r)]$, $$g_n(r) = FT^{-1}[FT[\text{geometry}_n] \cdot G_d(k)] = FT^{-1}[g_n(k)],$$

$$G = \begin{pmatrix} 1 \\ g_1(r) \\ g_2(r) \\ g_3(r) \\ \vdots \\ g_n(r) \end{pmatrix}, \; \varphi_{lsq} = \begin{pmatrix} \sum \varphi_m(r) \\ \sum \varphi_m(r) \cdot g_1(r) \\ \sum \varphi_m(r) \cdot g_2(r) \\ \sum \varphi_m(r) \cdot g_3(r) \\ \vdots \\ \sum \varphi_m(r) \cdot g_n(r) \end{pmatrix}, \text{ and } \chi = \begin{pmatrix} \chi_0 \\ \chi_1 \\ \chi_2 \\ \chi_3 \\ M \\ \chi_n \end{pmatrix}.$$

$$G_{lsq} = \begin{pmatrix} N & \sum g_1(r) & \sum g_2(r) & \sum g_3(r) & \cdots & \sum g_n(r) \\ \sum g_1(r) & \sum g_1^2(r) & \sum g_1(r) \cdot g_2(r) & \sum g_1(r) \cdot g_3(r) & \cdots & \sum g_1(r) \cdot g_n(r) \\ \sum g_2(r) & \sum g_2(r)g_1(r) & \sum g_2^2(r) & \sum g_2(r)g_3(r) & \cdots & \sum g_2(r) \cdot g_n(r) \\ \sum g_3(r) & \sum g_3(r)g_1(r) & \sum g_3(r)g_2(r) & \sum g_3^2(r) & \cdots & \sum g_3(r) \cdot g_n(r) \\ \vdots & \vdots & \vdots & \vdots & \ddots & \vdots \\ \sum g_n(r) & \sum g_n(r)g_1(r) & \sum g_n(r)g_2(r) & \sum g_n(r)g_3(r) & \cdots & \sum g_n^2(r) \end{pmatrix}.$$

Removal of Rapid Phase Aliasing Arising from Local Magnetic Susceptibility Differences When an object with a particular magnetic susceptibility distribution, $\chi(r)$, is placed in an external magnetic field $B_0$, the magnetic field, $B(r)$ experienced at any position r is given by:

$$B(r) = B_0 + \frac{\mu_0}{4\pi} \int_{V'} \left\{ \frac{3\dot{M}\left(\frac{1}{r'}\right) \cdot \left(\frac{1}{r} - \frac{1}{r'}\right)}{\left|\frac{r}{r} - \frac{r}{r'}\right|^5} \left(\overline{r} - \overline{r'}\right) - \frac{\dot{M}\left(\frac{1}{r'}\right)}{|r - r'|^3} \right\} dV' \quad (19)$$

where $M(r)$ is the induced magnetization distribution of the object. In practice, the external applied magnetic field $B_0$ is many orders of magnitude larger in one direction, assumed to be the z direction, than in the other two orthogonal directions. Taking this into account, and observing that the second term in the above equation (referred to as $B_{dz}(r)$) is a convolution, this term can be Fourier transformed into a simple product relation in the spatial frequency domain (k-space) to yield $B_{dz}(k)$:

$$B_{dz}(k) = \mu_0 M_z(k) \left( \frac{1}{3} - \frac{k_z^2}{k_x^2 + k_y^2 + k_z^2} \right) \quad (20)$$

where, $k_x$, $k_y$, and $k_z$ are the coordinates in k-space and $M_z(k)$ is the Fourier transform of the magnetization distribution of the object. This spatially varying field $B_{dz}(r)$ gives rise to the spatially varying phase seen in a gradient echo MR experiment. Since the susceptibilities of biological tissue are typically <<<1, $M(r)$ can be written as $M(r)=\chi(r) \cdot B_0/\mu_0$ and hence $M_z(k)=FT(\chi(r)) \cdot (B_0/\mu_0)$. Thus, the phase due to a spatially varying field $B_{dz}(r)$, which itself arises from the presence of the susceptibility distribution $\chi(r)$ can be calculated from $-\gamma B_{dz}(r)TE$ as follows:

$$\phi = -\gamma \cdot B_{dz}(r) \cdot TE \quad (21)$$

$$= -\gamma \cdot B_0 \cdot TE \cdot FT^{-1} \left[ FT(\chi(r)) \cdot \left( \frac{1}{3} - \frac{k_z^2}{k_x^2 + k_y^2 + k_z^2} \right) \right]$$

This equation yields a fast and powerful means for calculating the field deviation due to the presence of a known $\chi(r)$ distribution in an otherwise uniform field $B_0$. It is important to note here that these equations are derived under the assumption that $B_0$ is the predominant magnetizing field and that the $B_{dz}$ field does not affect the magnetization of the object. This is referred as the Born approximation. This approximation and the linearity of the Fourier theory makes it feasible to simulate the effects of any complicated structure as the linear sum of the fields from the sub-structures each with uniform but different susceptibilities $\chi_i$ (i refers to the $i^{th}$ sub-structure) as follows:

$$\phi = -\gamma \cdot B_0 \cdot TE \cdot \quad (22)$$

$$FT^{-1} \left[ (\chi_1 \cdot g_1 + \chi_2 \cdot g_2 + \chi_3 \cdot g_3 K \chi_n \cdot g_n) \cdot \left( \frac{1}{3} - \frac{k_z^2}{k_x^2 + k_y^2 + k_z^2} \right) \right]$$

In this equation, $g_1, g_2 \ldots g_n$ are the spatial Fourier transformations of the geometries of the individual sub-structures.

The susceptibilities of each of the sub-structures can be found by using a measured un-aliased phase map/field map, using a mean-squared-field error minimization approach or using the iterative least-squared approach described above. Once a reasonable estimate of the susceptibilities of the sub-structures is known, the phase due to these sub-structures can be calculated using the last mentioned equation and their contribution can be removed from the measured phase map through complex division. Depending on the sub-structures included in Eq. (22), the result of this process is a phase image which is devoid of any geometry related phase arising from those sub-structures included in Eq. (22) and contains only phase from those sub-structures that are not included in Eq. (22) and also contributions from eddy current effects during data collection. If desired, the process can be repeated using a plurality of other regions, which in some cases may further refine areas of the image. Moreover, the iterative least-squares approach described above can be applied to this new image to quantify the susceptibility of local tissue and/or obtain an accurate susceptibility map or image. Still further, a high pass filter can be applied to the revised data. The susceptibility map in its corresponding phase form or the revised phase image, with or without a filter, can further be used to generate a susceptibility weighted image in the manner described and disclosed in U.S. Pat. No. 6,658,280, titled Susceptibility Weighted Imaging, which is hereby incorporated in its entirety by reference.

In view of the foregoing, it should be appreciated that the invention achieves several advantages over prior art methods. For example, the present invention can be used to remove geometry dependent phase from magnetic resonance data based on the geometries of the objects (such as volumes of air or tissue) contained within the scanned subject matter (such as a human brain). The geometries can be determined by computer and/or with human judgement and can be based on the MR data obtained from the scan or from another source. Additionally, magnetic resonance imaging usually offers information about relaxation times, spin density and other measures of tissue properties such as diffusion, perfusion, and spectroscopy. Susceptibility mapping offers a new type of information related to elements and structures that change the local magnetic fields in the tissue such as iron and calcium. Mapping susceptibility can be a means by which to both image iron and estimate or quantify the amount of iron present in the tissue. This can have significant impact on identifying certain diseases such as Parkinson's disease, Huntington's disease, hemachromotosis, hemarthrosis (joint trauma), and other iron related diseases as well as for imaging calcium for breast cancer studies. Thus, the iterative process of generating a susceptibility map, in accordance with the present invention, has numerous potential uses.

As various modifications could be made in the constructions and methods herein described and illustrated without departing from the scope of the invention, it is intended that all matter contained in the foregoing description or shown in the accompanying drawings shall be interpreted as illustrative rather than limiting. Thus, the breadth and scope of the present invention should not be limited by any of the above-described exemplary embodiments, but should be defined only in accordance with the following claims appended hereto and their equivalents.

It should also be understood that when introducing elements of the present invention in the claims or in the above description of the preferred embodiment of the invention, the terms "comprising," "including," and "having" are intended to be open-ended and mean that there may be additional elements other than the listed elements. Additionally, the term "portion" should be construed as meaning some or all of the item or element that it qualifies. Moreover, use of identifiers such as first, second, and third should not be construed in a manner imposing any relative position or time sequence between limitations. Still further, the order in which the steps of any method claim that follows are presented should not be construed in a manner limiting the order in which such steps must be performed.

What is claimed is:

1. A method comprising:
   obtaining magnetic resonance phase data of an object;
   assigning a phase value to each of a plurality of voxels, the phase values being dependent upon the phase data;
   dividing the plurality of voxels into at least first and second regions;
   assigning an initial susceptibility value to each of the voxels of the first region, the initial susceptibility values of the voxels of the first region being identical to each other;
   assigning an initial susceptibility value to each of the voxels of the second region, the initial susceptibility values of the voxels of the second region being identical to each other;
   determining which of the plurality of voxels meet a criteria, the criteria being dependent upon a signal-to-noise ratio of the phase values;
   assigning a revised susceptibility value to each of the voxels of the first region, the revised susceptibility values of the voxels of the first region being identical to each other and being dependent upon the phase data associated with only the voxels that meet the criteria;
   assigning a revised susceptibility value to each of the voxels of the second region, the revised susceptibility values of the voxels of the second region being identical to each other, different from the susceptibility values of the voxels of the first region, and dependent upon the phase data associated with only the voxels that meet the criteria; and
   generating an image that is dependent upon the revised susceptibility values.

2. A method in accordance with claim 1 further comprising iteratively repeating the steps of determining which of the plurality of voxels meet a criteria, assigning a revised susceptibility value to each of the voxels of the first region, and assigning a revised susceptibility value to each of the voxels of the second region, and wherein the step of determining which of the plurality of voxels meet a criteria in each iteration is dependent upon the revised susceptibility values assigned in the previous iteration.

3. A method in accordance with claim 2 wherein the repeating of the steps continues until the revised susceptibility values near convergence.

4. A method in accordance with claim 3 wherein the image generated in the step of generating an image is a susceptibility map that is dependent upon the revised susceptibility values after iteratively repeating the steps.

5. A method in accordance with claim 1 wherein the image generated in the step of generating an image is a susceptibility weighted image.

6. A method in accordance with claim 1 wherein the step of dividing the plurality of voxels into at least first and second regions is based on a determination that each of the regions can be treated as having a uniform susceptibility, and wherein the determination is performed by a microprocessor.

7. A method comprising:
   obtaining magnetic resonance phase data of an object;
   assigning a first phase value to each of a plurality of voxels, the first phase values being dependent upon the phase data;
   dividing the plurality of voxels into at least first and second regions;
   assigning each of the voxels in the first region a susceptibility value;
   estimating an induced phase value for each of the voxels of the second region, the induced phase values being dependent upon the susceptibility values of the voxels of the first region;
   generating revised phase values for each of the voxels of the second region, the revised phase values being dependent upon the first phase values and the induced phase values; and
   generating an image that is dependent upon the revised phase values.

8. A method in accordance with claim 7 wherein the image is a susceptibility weighted image.

9. A method in accordance with claim 8 wherein the image is a susceptibility map.

10. A method in accordance with claim 7 wherein the step of generating revised phase values for each of the voxels of the second region consists of subtracting the induced phase value of such voxel from the first phase value of such voxel.

11. A method in accordance with claim 7 wherein the step of dividing the plurality of voxels into at least first and second regions is based on a determination that the voxels of the first region correspond to a region of the object that has a first uniform susceptibility and that the voxels of the second region correspond to another region of the object that has a second uniform susceptibility that differs from the first uniform susceptibility.

12. A method in accordance with claim 11 wherein the determination is made by a microprocessor.

13. A method in accordance with claim 11 wherein the step of assigning each of the voxels in the first region a susceptibility value occurs in a manner such that the voxels in the first region are assigned identical susceptibility values.

14. A method in accordance with claim 7 further comprising:
  assigning each of the voxels in the second region a susceptibility value, the susceptibility values of the voxels in the second region being identical to each other;
  estimating an induced phase value for each of the voxels of the first region, the induced phase values being dependent upon the susceptibility values of the voxels of the second region;
  generating revised phase values for each of the voxels of the first region, the revised phase values being dependent upon the first phase values and the induced phase values of the voxels in the first region; and
  wherein the step of generating an image of the object comprises using the revised phase values of the voxels in the first and second regions to generate the image of the object.

15. A method in accordance with claim 14 wherein the steps of assigning each of the voxels in the first region a susceptibility value, and assigning each of the voxels in the second region a susceptibility value comprises an iterative mean-squared-field-error minimization technique to obtain the susceptibility values.

16. A method in accordance with claim 7 wherein the steps of assigning each of the voxels in the first region a susceptibility value, and assigning each of the voxels in the second region a susceptibility value comprises a discrete least squares susceptibility estimation algorithm to obtain the susceptibility values.

17. A method in accordance with claim 7 further comprising:
  determining which of the plurality of voxels meet a criteria, the criteria being dependent upon a signal-to-noise ratio of the revised phase values;
  assigning a revised susceptibility value to each of the voxels of the first region, the revised susceptibility values of the voxels of the first region being identical to each other and being dependent upon the phase data associated with only the voxels that meet the criteria; and
  assigning a revised susceptibility value to each of the voxels of the second region, the revised susceptibility values of the voxels of the second region being identical to each other, different from the susceptibility values of the voxels in the first region, and dependent upon the phase data associated with only the voxels that meet the criteria.

18. A method in accordance with claim 7 further comprising:
  assigning an initial susceptibility value to each of the voxels of the first region, the initial susceptibility values of the voxels of the first region being identical to each other;
  assigning an initial susceptibility value to each of the voxels of the second region, the initial susceptibility values of the voxels of the second region being identical to each other;
  determining which of the plurality of voxels meet a criteria, the criteria being dependent upon a signal-to-noise ratio of the phase values;
  assigning a revised susceptibility value to each of the voxels of the first region, the revised susceptibility values of the voxels of the first region being identical to each other and being dependent upon the phase data associated with only the voxels that meet the criteria; and
  assigning a revised susceptibility value to each of the voxels of the second region, the revised susceptibility values of the voxels of the second region being identical to each other, different from the susceptibility values of the voxels of the first region, and dependent upon the phase data associated with only the voxels that meet the criteria.

19. A method in accordance with claim 7 further comprising:
  dividing the plurality of voxels into at least third and fourth regions;
  estimating a second induced phase value for each of the voxels of the fourth region, the second induced phase values being dependent upon susceptibility values of the voxels of the third region; and
  generating second revised phase values for each of the voxels of the third region, the revised phase values being dependent upon the revised phase values and the second induced phase values.

* * * * *